United States Patent [19]
Frequin

[11] Patent Number: 4,812,908
[45] Date of Patent: Mar. 14, 1989

[54] AUTOMATIC GAIN CONTROL CIRCUIT HAVING A CONTROL LOOP INCLUDING A CURRENT THRESHOLD CIRCUIT

[75] Inventor: Vincentius T. M. Frequin, Eindhoven, Netherlands

[73] Assignee: U.S. Philips Corporation, New York, N.Y.

[21] Appl. No.: 180,587

[22] Filed: Apr. 7, 1988

Related U.S. Application Data

[63] Continuation of Ser. No. 919,292, Oct. 15, 1986, abandoned.

[30] Foreign Application Priority Data

Oct. 21, 1985 [NL] Netherlands ............... 8502861

[51] Int. Cl.$^4$ ............................................. H04N 5/52
[52] U.S. Cl. ................................... 358/174; 358/179; 330/254; 455/245
[58] Field of Search ............... 358/174, 179, 170; 455/239, 245, 234; 330/254, 257, 278, 283, 129, 133

[56] References Cited

U.S. PATENT DOCUMENTS

| | | | |
|---|---|---|---|
| 2,773,121 | 12/1956 | Janssen | 358/179 |
| 3,487,163 | 12/1969 | Brugler | 358/174 |

FOREIGN PATENT DOCUMENTS

| | | | |
|---|---|---|---|
| 188281 | 10/1984 | Japan | 358/174 |
| 223270 | 11/1985 | Japan | 358/174 |

Primary Examiner—Tommy P. Chin
Attorney, Agent, or Firm—Edward W. Goodman

[57] ABSTRACT

An automatic gain control circuit having different control loops which must each be controlled in a different control current range by one and the same control current, includes a current threshold circuit having an input to which a threshold current source (7) and the emitters of a complementary transistor pair are connected so that the collector current of each transistor can control a control loop.

4 Claims, 2 Drawing Sheets

AUTOMATIC GAIN CONTROL CIRCUIT HAVING A CONTROL LOOP INCLUDING A CURRENT THRESHOLD CIRCUIT

This is a continuation of application Ser. No. 919,292, filed Oct. 15, 1986 now abandoned.

BACKGROUND OF THE INVENTION

The invention relates to an automatic gain control circuit including a current threshold circuit which has a first and a second transistor, a control electrode of the first transistor being connected to the input of the current threshold circuit, the collector of said first transistor supplying a current to a control loop of the automatic gain control circuit which on one side of a threshold value depends on the current conveyed by the input and on the other side of said threshold value substantially does not depend on said current.

An automatic gain control circuit including a current threshold circuit of the type described above is known from U.S. Pat. No. 3,813,603 in which the input of the current threshold circuit is connected to the base of the first transistor and the emitter of the first transistor is connected to the base of the second transistor and a diode arranged in parallel with the base emitter junction of the second transistor. The collector of the second transistor supplies a current depending on the input current on either side of the threshold value.

SUMMARY OF THE INVENTION

It is an object of the invention to provide an automatic gain control circuit including a current threshold circuit in which at least two output currents can be obtained which are each dependent on the input current of the threshold circuit on only one opposite side of the threshold value, so that control loops with separate control ranges can be obtained.

To this end, an automatic gain control circuit including a current threshold circuit of the type described in the opening paragraph is disclosed wherein the control electrode connected to the input is the emitter of the first transistor to which a current source is also connected which determines the threshold value, while a current-conducting circuit for the current of this current source is formed by the emitter of the second transistor connected to the input, which transistor has a conductivity type which is opposite to that of the first transistor.

Currents each depending on the input current of the threshold circuit only on one opposite side of the threshold value can now be derived from the collectors the two transistors.

Automatic gain control circuits in which several control loops must preferably have a separate control range are, for example, those in which the automatic gain control loops comprise the radio frequency and intermediate frequency parts, respectively, of a radio or television receiver.

It should be noted that U.S. Pat. No. 3,699,464 discloses a push-pull amplifier with a suppressed output signal trajectory, which comprises a complementary transistor pair whose through-connected emitters are driven by a differential amplifier having a differential current output. Connected to each collector of the complementary transistor pair is a current threshold circuit which is constituted by an output transistor whose base is connected to the collector of the relevant transistor of the complementary transistor pair and whose emitter is connected to a first and a second supply voltage terminal, respectively, while a threshold current source is arranged between the emitters and bases of each of these output transistors, which threshold current sources, in co-operation with two resistors in the differential amplifier, determine the suppression trajectory of the output signal. The output signal is obtained at a load resistor connected between the collectors of the output transistors.

DESCRIPTION OF THE DRAWINGS

The invention will now be described in greater detail with reference to the drawings.

IN THE DRAWINGS

Figure 1:
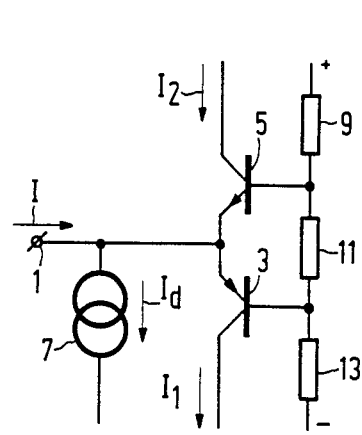
Figure 2:
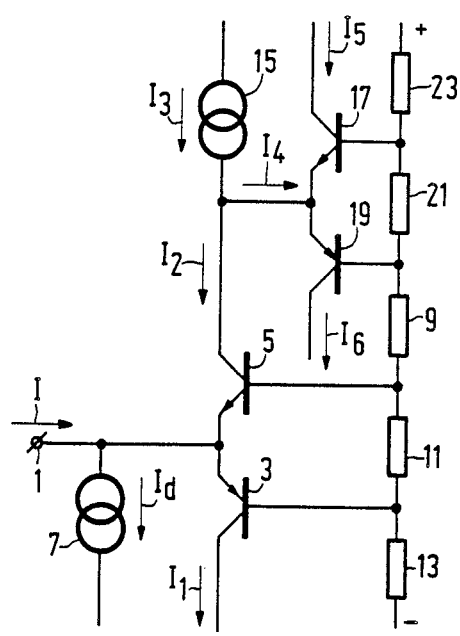
Figure 3:
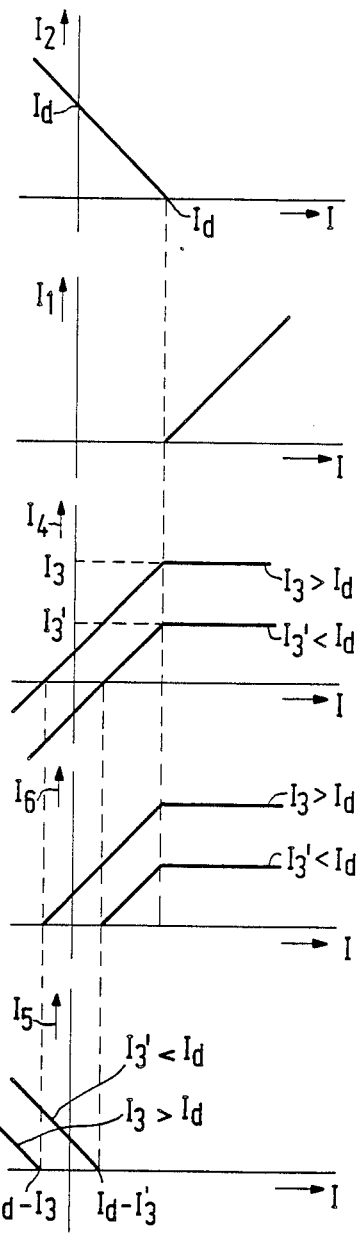
Figure 4:
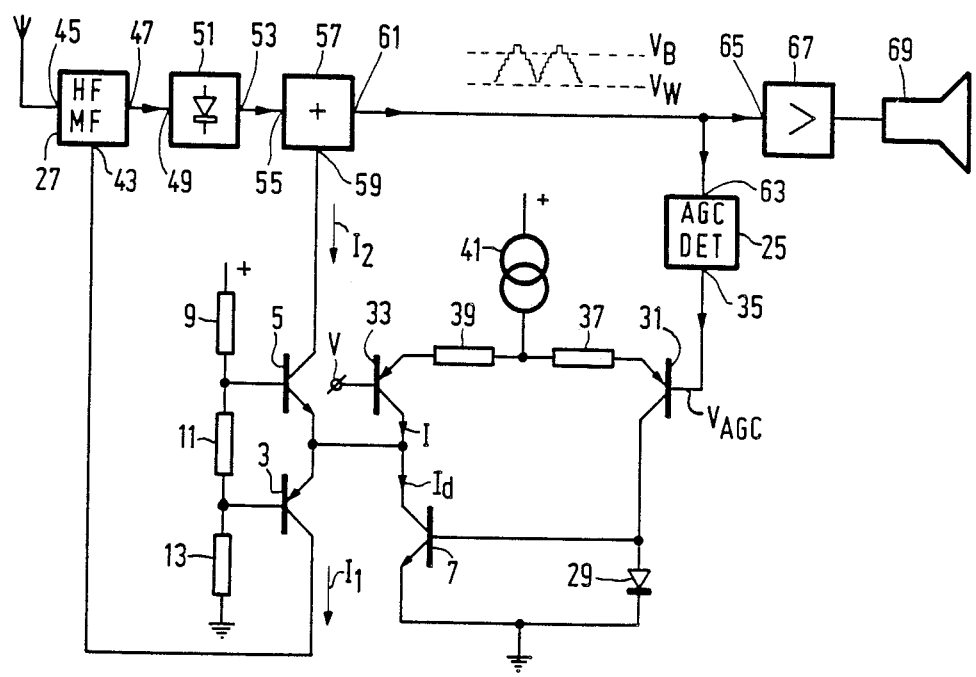

FIG. 1 shows the principle of a current threshold circuit as can be used in an automatic gain control circuit according to the invention;

FIG. 2 shows a combination of two current threshold circuits as can be used in an automatic gain control circuit according to the invention;

FIG. 3 shows a number of characteristic curves representing the currents at different positions in the circuits of FIGS. 1 and 2 as a function of the input current; and FIG. 4 shows a possible embodiment of an automatic gain control circuit according to the invention.

DETAILED DESCRIPTION

In FIG. 1 an input 1 of the current threshold circuit is connected to the emitter of a first transistor 3 of the pnp type, to the emitter of a second transistor 5 of the npn type and to a threshold current source 7 carrying a threshold current $I_d$ which is conveyed by the second transistor 5 when the input current I of the circuit is zero.

The bases of the first and second transistors 3, 5 are connected to taps of a potential divider 9, 11, 13 so that the voltage between these bases is less than twice the base-emitter voltage at which a transistor becomes conducting. Consequently only one of the two transistors can conduct at a time, the second transistor 5 conducting as long as the input current I is smaller than the threshold current $I_d$ and the first transistor conducting when the input current I is larger than the threshold current $I_d$.

The collector currents $I_1$ of the first transistor 3 and $I_2$ of the second transistor 5 are shown in the upper two graphs of FIG. 3 as a function of the input current I.

In FIG. 2, of the same reference numerals and current indications as in FIG. 1 have been used for corresponding components.

The collector of the second transistor 5 is now connected to a further threshold current source 15 supplying a second threshold current $I_3$ and to the emitters of a third transistor 17 of the npn type and of a fourth transistor 19 of the pnp type.

The bases of the transistors 17 and 19 are connected to taps of the potential divider which in this case is extended by two resistors 21, 23. The voltage between these bases is again such that only one of the transistors 17, 19 can conduct.

The current $I_4$ to the emitters of the transistors 17, 19, the current $I_5$ to the collector of the third transistor 17 and the current $I_6$ supplied by the collector of the fourth transistor 19 are shown in the third, fifth and fourth characteristic curves, respectively, of FIG. 3 as a function of the input current I for two cases, the first being the case in which the further threshold current $I_3$ is larger than the threshold current $I_d$ and the second being the case in which the further threshold current $I_3$ is smaller than the threshold current $I_d$.

The graphs of FIG. 3 show that different combinations of currents may be formed which may be used as control currents in an automatic gain control circuit different parts of which are preferably not to be controlled simultaneously by the input current.

FIG. 4 shows an example of such a circuit. It is a television receiver having a d.c. level control of a video signal which is applied to an AGC detector 25 for a small received signal amplitude and having an automatic gain control AGC of a radio frequency and intermediate frequency part 27 for a large received signal amplitude as described in U.S. Pat. No. 2,773,121. Unlike the prior art mode, the d.c. control is switched off in this case when the radio frequency and intermediate frequency control commences, and conversely.

The same reference numerals and current indications as in FIG. 1 have been used for corresponding components.

In this case the threshold current source 7 is an npn transistor arranged as a current mirror. Its base-junction is arranged in parallel with a diode 29 and the connection between the base and the diode 29 is connected to the collector of a pnp transistor 31 which forms an emitter-coupled pair with a further pnp transistor 33, which pair serves as a differential amplifier for the voltage difference between the base of the transistor 31 connected to an output 35 of the AGC detector 25 and the base of the transistor 33 connected to a reference voltage V. The emitters of the transistors 31, 33 are each connected via resistors 37, 39 to a current source 41. The collector of the transistor 33 is connected to the emitters of the transistors 3 and 5 and to the collector of the threshold current source of transistor 7.

The collector of the first transistor 3 is connected to a control signal input 43 of the radio frequency and intermediate frequency part 27 in which an input 45 received signal and an output 47 applies an intermediate frequency signal to an input 49 of a detection circuit 51.

When a television signal is received at the input 45, an output 53 of the detection circuit 51 applies a video signal to an input 55 of a combination circuit 57, a control signal input 59 of which is connected to the collector of the second transistor 5, and an output 61 is connected to an input 63 of the AGC detector 25 and to an input 65 of a video signal processing circuit 67 controlling a picture display tube 69.

In the case of large signal amplitudes of the received television signal, the voltage $V_{AGC}$ at the output 35 of the AGC detector 25 is assumed to be higher than the reference voltage V, so that the collector current I of the transistor 33 is larger than the collector current $I_d$ of the transistor 7. The current $I_1$ applied by the collector of the first transistor 3 to the control signal input 43 of the radio frequency and intermediate frequency part 27 now varies with the amplitude of the received television signal and controls the black level $V_B$ of the video signal at a constant value. The white level $V_W$ of the video signal maintains a constant value independent of the control, because the collector current $I_2$ of the second transistor is then zero.

When the amplitude of the received television signal becomes smaller, the voltage $V_{AGC}$ decreases and the second transistor 5 will start conducting when $V_{AGC} < V$. A control of the white level $V_W$ then occurs via $I_2$ in the video signal, which increases until its black level $V_B$ has again approximately the same value as in the case when $V_{AGC} > V$.

In this case, if the load resistor of the detection circuit 51 were connected to ground, a current mirror circuit incorporated in the combination circuit 57 thus would have to convert the current $I_2$ into a current to the detection resistor in order to obtain an increase of the white level $V_W$ at an increasing value of $I_2$.

What is claimed is:

1. An automatic gain control circuit having a control loop for controlling a gain in said circuit in dependence on a signal level in said circuit, said control loop including means for varying said gain, a current threshold circuit for producing a control signal in said control loop for said varying means for controlling the gain, and means for detecting said signal level and for generating an input current for said current threshold circuit, said current threshold circuit comprising a first transistor; a second transistor having a conductivity type opposite to that of said first transistor; and a current source coupled, respectively, to emitters of said first and second transistors, for determining a threshold level of said current threshold circuit, said emitters receiving said input current indicative of said signal level and a collector of said first transistor providing a collector current for establishing said control signal, wherein, when said input current is below said threshold level, said collector current depends on said input current, and when said input current exceeds said threshold level, said collector current substantially does not depend on said input current.

2. An automatic gain control circuit as claimed in claim 1, wherein the current source determining the threshold level is included in a differential current output circuit of a differential amplifier having an emitter-coupled transistor pair, a collector of one of the transistors of the transistor pair being coupled via a current mirror circuit to a collector of the other transistor of the transistor pair, and a base of one of the transistors of the transistor pair being an input for a threshold voltage determining the threshold level, and a base of the other transistor of the transistor pair being an input for a voltage to be converted into a threshold current value.

3. An automatic gain control circuit as claimed in claim 1, wherein said automatic gain control circuit is included in a television receiver in which, during the reception of a small amplitude television signal, a collector of the second transistor of the current threshold circuit utilizes a control current for a control of a d.c. level of a video signal applied to an AGC detector, and, during reception of a larger amplitude television signal, the collector of the first transistor utilizes the collector current for gain control of a radio frequency and intermediate frequency part of the television receiver.

4. An automatic gain control circuit as claimed in claim 3, further comprising:
   a supplemental current threshold circuit having an input coupled to the collector of at least one of the first and second transistors of said current threshold circuit.

* * * * *